United States Patent [19]

Eiermann et al.

[11] Patent Number: 4,713,729
[45] Date of Patent: Dec. 15, 1987

[54] DEVICE FOR AVOIDING LOCAL OVERHEATING ON MEASURING TRANSDUCERS

[75] Inventors: Kurt Eiermann, Pfungstadt; Karl Ehinger, Karlstein, both of Fed. Rep. of Germany

[73] Assignee: Degussa Aktiengesellschaft Corporation, Frankfurt am Main, Fed. Rep. of Germany

[21] Appl. No.: 28,058

[22] Filed: Mar. 19, 1987

Related U.S. Application Data

[63] Continuation of Ser. No. 798,799, Nov. 15, 1985, abandoned.

[30] Foreign Application Priority Data

Nov. 30, 1984 [DE] Fed. Rep. of Germany ....... 3443702

[51] Int. Cl.$^4$ ............................................... H05K 7/20
[52] U.S. Cl. ................................. 361/386; 174/52 PE

[58] Field of Search ................... 174/52 PE; 361/383, 361/386–388; 338/253, 315, 320

[56] References Cited

U.S. PATENT DOCUMENTS

| | | | |
|---|---|---|---|
| 3,581,266 | 5/1971 | Weyenberg | 174/52 PE |
| 3,783,345 | 1/1974 | Taylor | 174/52 PE |
| 4,147,889 | 4/1979 | Andrews | 361/388 |
| 4,230,901 | 10/1980 | Wengler | 174/52 PE |

FOREIGN PATENT DOCUMENTS 2937218 4/1981 Fed. Rep. of Germany .

Primary Examiner—G. P. Tolin
Attorney, Agent, or Firm—Cushman, Darby & Cushman

[57] ABSTRACT

In order to avoid local overheating on the surface of an intrinsically safe measuring transducer provided with current limiting resistors and embedded in a sealing composition, a body of a good heat conducting material is arranged within the sealing composition in the vicinity of the current limiting resistors.

5 Claims, 2 Drawing Figures

DEVICE FOR AVOIDING LOCAL OVERHEATING ON MEASURING TRANSDUCERS

This is a continuation of application Ser. No. 798,799, filed Nov. 15, 1985, which was abandoned upon the filing hereof.

BACKGROUND OF THE INVENTION

The invention is directed to a device for avoiding local overheating of intrinsically safe measuring transducers embedded in a sealing composition and provided with current limiting resistors with the assistance of bodies made of a good heat conducting material.

It is customary in chemical process engineering to raise the signals sensitive to disturbances of primary elements such as, e.g., thermoelements and resistance thermometers, to a signal level which only has a slight sensitivity to disturbance through the use of measuring transducers, also called transmitters, so that these signals can be carried over great distances. Thus, it is customary, for example, to use as the carrying signal a current impressed by the measuring transducer depending on the size of the measuring signal.

It is suitable for reducing the disturbance to hold the cable between the measuring element and the measuring transducer as short as possible. Therefore, customarily such measuring transducers are mounted in the direct vicinity of the measuring assembly of, e.g., thermoelements. It is ideal to install the measuring transducer in the connection head of the assembly itself.

There is frequently the danger of explosions in chemical plants, especially in organic chemistry plants. Electrical machining employed in these areas, therefore, are not allowed to contain any undesired ignition sources. In regard to this, there are a set of corresponding legal codes (e.g., Factory Mutual Approval Standards).

Various types of protection are permitted to protect electrical machinery from explosion. For measuring apparatus, such as, e.g., measuring transducers, there has especially come into use the type of protection called "intrinsically safe". With this type of protection, care must be taken that the voltages and currents occurring in machinery in a space endangered by the possibility of explosion are held so small that their energy is not sufficient for ignition of explosive gas mixtures. In other words, care must be taken so that there is no local overheating in the measuring transducer in the area subject to the danger of explosion which would release an explosion if it came into contact with an ignitable mixture. Therefore, it is customary to tightly seal such measuring transducers with special sealing compositions.

Local overheating also must be safely avoided if a disturbance occurs and if a partial or complete short circuit is present in the measuring transducer. Therefore, it is customary in this case to also embed in the sealing composition especially reliable prominent current limiting resistors. However, in the case of a disturbance, wattages are transformed in these resistors which lead to excess temperatures at the resistor which themselves are sufficient for ignition. It is true that through the sealing composition the ignitable mixture is kept away from the hot resistor, but care must be taken that the outer temperature of the sealing composition at no place reaches the ignition point. Futhermore, the sealing coposition cannot be allowed to be damaged at any place by the high excess temperature of the current limiting resistors so that no cracks are formed so that the ignitable mixture reaches the hot resistor. This creates difficulties in small structures in which it is easy to have localization of heat, such as in, e.g., transmitters which should be mounted in the connection head of assemblies.

There is known from German OS No. 2937218 a device for avoiding local overheating on transmitters in sealing compositions, which transmitters are provided with current limiting resistors whereby the surfaces of the sealing compositions are provided with one or more good heat conducting boundary surfaces for the dissipation of heat. There are specially used for this purpose sheets and panels made of copper or aluminum. However, this apparatus has the disadvantage that there must be contact protection for the metal surfaces which can occur through ground. Therefore, in many cases, there must be provided additional measures for grounding which can lead to problems in high frequency sweep radiation since the potential of the inner circuitry of the measuring transducer customarily must be independent of the ground potential.

Therefore, it was the purpose of the present invention to develop an apparatus for avoiding local overheating of "intrinsically safe" measuring transducers embedded in sealing compositions and provided with current limiting resistors with the assistance of bodies made of a good heat conducting material such that additional grounding is unnecessary.

SUMMARY OF THE INVENTION

This problem has been solved according to the invention by arranging the body within the sealing composition in the vicinity of the current limiting resistors.

It is especially advantageous to arrange the bodies, preferably in the form of plates or hollow cylinders, in the direct vicinity of the current limiting resistors.

It has been surprisingly found that local overheating on and in the sealing composition also can be safely prevented if a good heat conducting body is arranged within the sealing composition and thus can exert either no or only minimal cooling functions. The body made of good heat conducting material thereby is embedded in the sealing composition in such a manner that it does not enter the surface of the sealing composition at any point. Therewith, contact protection is automatically provided and grounding is not necessary.

The body preferably consists of metal, such as copper or aluminum, however, it can also be constructed of a good heat conducting ceramic, for example, beryllium oxide, aluminum oxide, or aluminum nitride.

DETAILED DESCRIPTION

Figure 1:
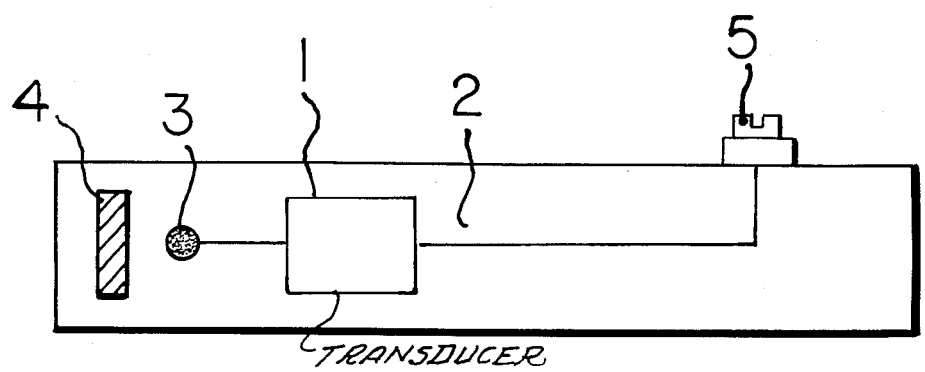
FIG. 1 schematically shows one form of a measuring transducer embedded in a sealing composition provided with the device of the invention.
Figure 2:
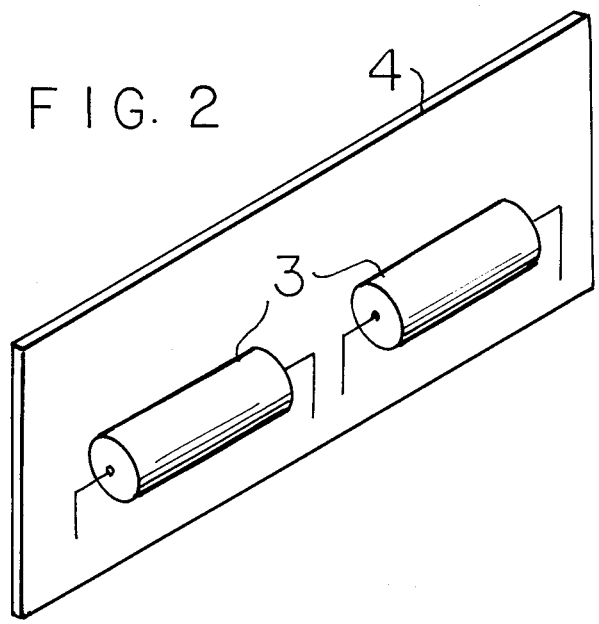
FIG. 2 schematically shows a heat conducting body in the form of a plate.

As shown in FIG. 1, there is embedded within the sealing composition 2 current limiting resistor 3 of the measuring transducer 1. In the vicinity of the resistors 3, there is arranged a body 4 made of a good heat conducting material, e.g., copper. The signals of the transducer 1 are transmitted via the connecting terminal 5.

The heat conducting bodies may be in the form of plates or hollow cylinders in the direct vicinity of the current limiting resistors.

Measurements have shown that even in the case of disturbance, there does not occur point to point overheating on the surface of the measuring transducer which could serve as the source of ignition in the presence of an explosive atmosphere.

The entire disclosure of German priority application No. P.3443702.9 is hereby incorporated by reference.

What is claimed is:

1. A device for avoiding local overhating comprising: an intrinsically safe measuring transducer;
   a sealing composition in which said transducer is embedded;
   a current limiting resistor connected to said transducer; and
   a single body made of a good heat conducting material spaced from but within the direct vicinity of the current limiting resistor and entirely embedded within said sealing composition so as to distribute heat more uniformly over the entire surface of said sealing composition than when said body is not present, said single body being the only good heat conducting material of said device so that heat is not dissipated at said surface of said sealing composition by other good heat conducting materials.

2. A device according to claim 1 wherein the body is made of copper or aluminum or of both copper and aluminum.

3. A device according to claim 2 wherein the body is in the form of a plate.

4. A device according to claim 1 wherein the body is made of beryllium oxide, aluminum oxide, aluminum nitride, or a mixture thereof.

5. A device according to claim 4 wherein the body is in the form of a plate.

* * * * *